US005644581A

United States Patent [19]
Wu

[11] Patent Number: 5,644,581
[45] Date of Patent: Jul. 1, 1997

[54] METHOD AND APPARATUS FOR CONVERTING LOGIC TEST VECTORS TO MEMORY TEST PATTERNS

[75] Inventor: Robert Han Wu, Austin, Tex.

[73] Assignee: Motorola, Inc., Schaumburg, Ill.

[21] Appl. No.: 494,464

[22] Filed: Jun. 26, 1995

[51] Int. Cl.$^6$ ...................................................... G06F 11/00
[52] U.S. Cl. ............................................................ 371/27
[58] Field of Search .............................. 371/27, 24, 25.1, 371/26; 395/183.01, 183.05, 183.08, 183.09, 183.1

[56] References Cited

U.S. PATENT DOCUMENTS 5,475,624  12/1995  West ........................................ 371/26

Primary Examiner—Vincent P. Canney
Attorney, Agent, or Firm—Daniel D. Hill

[57] ABSTRACT

Logic test vectors, used for testing logic circuitry on a logic tester, are converted to test patterns having a format that is used by a memory tester. This allows an integrated circuit having both logic circuitry and a memory array to be tested on a memory tester. A software tool, or computer program, is used to convert the logic test vectors to test patterns, and also generates the memory test code for applying the test patterns to, for example, a logic intensive integrated circuit memory. The software tool is encoded using a high-level programming language and is executed on a computer system (60). The program allows the logic intensive integrated circuit memory to be tested on a memory tester, as compared to testing the integrated circuit memory on a logic tester, significantly reducing testing costs associated with manufacturing.

21 Claims, 2 Drawing Sheets

METHOD AND APPARATUS FOR CONVERTING LOGIC TEST VECTORS TO MEMORY TEST PATTERNS

FIELD OF THE INVENTION

This invention relates generally to integrated circuits, and more particularly, to a method and an apparatus for converting logic test vectors to memory test patterns for testing an integrated circuit.

COPYRIGHT NOTICE

A portion of the disclosure of this patent document contains material which is subject to copyright protection. The copyright owner has no objection to the facsimile reproduction by any one of the patent disclosure, as it appears in the Patent and Trademark Office patent files or records, but otherwise reserves all copyright rights whatsoever.

BACKGROUND OF THE INVENTION

As one of the steps in the manufacture of an integrated circuit, the integrated circuit is tested to ensure that it functions properly and within established specifications. Typically, an integrated circuit containing logic circuits, such as a microprocessor or a microcontroller, are tested using a logic tester. Logic test vectors are created specifically for the integrated circuit to be tested, and the logic tester tests the integrated circuit using the logic test vectors. Integrated circuits such as static random access memories (SRAMs) or dynamic random access memories (DRAMs), are tested using memory testers. Memory test patterns are generated for testing the integrated circuit memory on the memory tester. Memory test code is generated for applying the memory test patterns to the integrated circuit memory under test.

Some integrated circuits include both logic and memory on the same integrated circuit device. For example, read only memory (ROM) and random access memory (RAM) are commonly included on microprocessors and digital signal processors, and application specific integrated circuit (ASIC) logic may be added to SRAMs. In addition, an integrated cache memory may include a cache controller, a data cache, and a cache TAG on the same integrated circuit as the memory array. A logic intensive integrated circuit memory, such as the integrated cache, may include as many as 20,000 logic gates and 1,000,000 memory cells.

There are software tools available that generate logic test vectors based on the design of a logic circuit for testing the logic circuit on a logic tester, but the logic test vectors are in a format for the logic tester. Some memory testers have the capability of automatically generating memory test patterns for testing a memory array. The memory test code is different from logic test code and memory test patterns are different from logic test patterns. This is because of the architectural differences between memory testers and logic testers.

An integrated circuit having both logic circuits and a memory array on the same integrated circuit device may be tested using a logic tester to test both the memory array (nonintensively) and the logic circuits (intensively). Alternately, the memory array may be tested on the memory tester, and the logic circuits may be tested on the logic tester. However, using both a logic tester and a memory tester to test an integrated circuit device is costly in terms of both time and money. Also, a logic tester is typically much more expensive to purchase than a memory tester.

DESCRIPTION OF A PREFERRED EMBODIMENT

Generally, the present invention provides a method and an apparatus for converting logic test vectors, for testing a logic circuit on a logic tester, to test patterns that can be used to test the logic circuit on a memory tester. This is accomplished using a software tool, or computer program, that converts the logic test vectors to the test patterns. Also, the program generates memory test code for applying the test patterns to an integrated circuit under test. The software tool includes instructions that have been encoded using a high-level programming language called Perl. In other embodiments, other programming languages may be used, such as C. The program can be used on any workstation or computer system that runs Perl. This software tool quickly translates logic test vectors to memory test patterns so that a logic intensive integrated circuit memory, such as an integrated cache, may be tested entirely on a memory tester. Testing the entire logic intensive integrated circuit memory on a memory tester, instead of partially on a logic tester and partially on a memory tester, or entirely on a logic tester, reduces costs and time associated with testing.

Logic test vectors usually include data to be written to the logic circuit, data to be read from the logic circuit, timing information, etc. The timing information may include information such as timing strobes, clock periods, and limiters. The data portion of a logic test vector may be written as digital ones and zeros, logic highs and lows, and "don't cares". A memory tester, such as an ADVANTEST T5363, manufactured by Advantest Corporation, requires the memory test patterns to be in a different format and include different information than the logic test vectors required for a logic tester such as the ADVANTEST T3382A, also manufactured by Advantest Corporation. Note that ADVANTEST is a registered trademark of Advantest Corporation in the U.S. Patent and Trademark Office.

Figure 1:
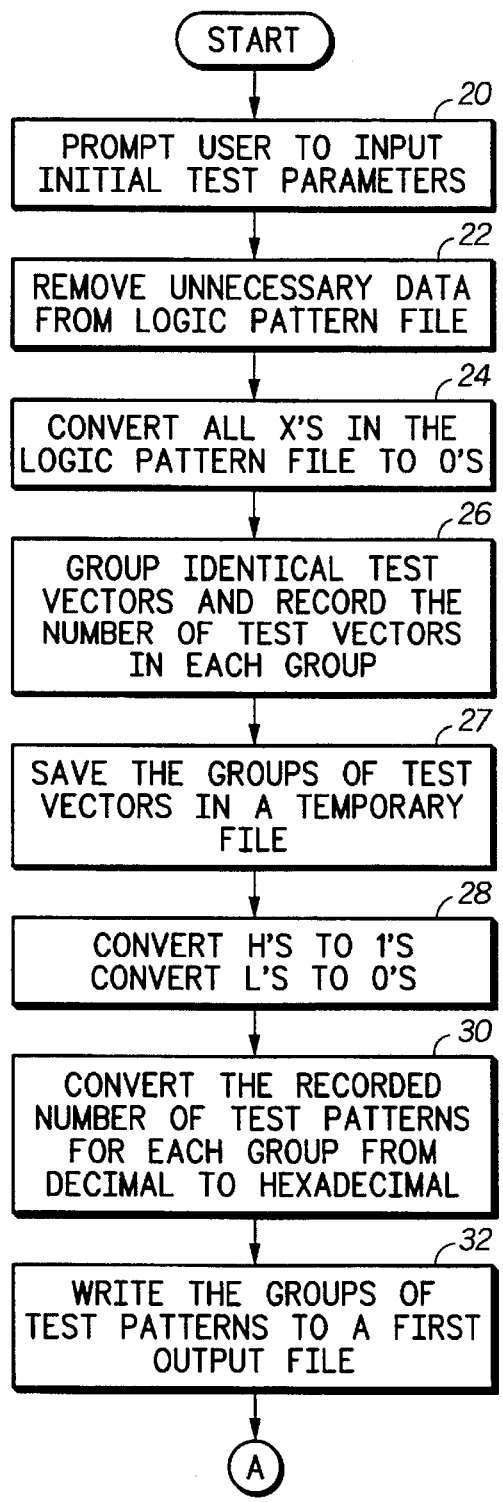
FIGS. 1 and 2 illustrate a flow chart in accordance with an embodiment of the present invention.
Figure 2:
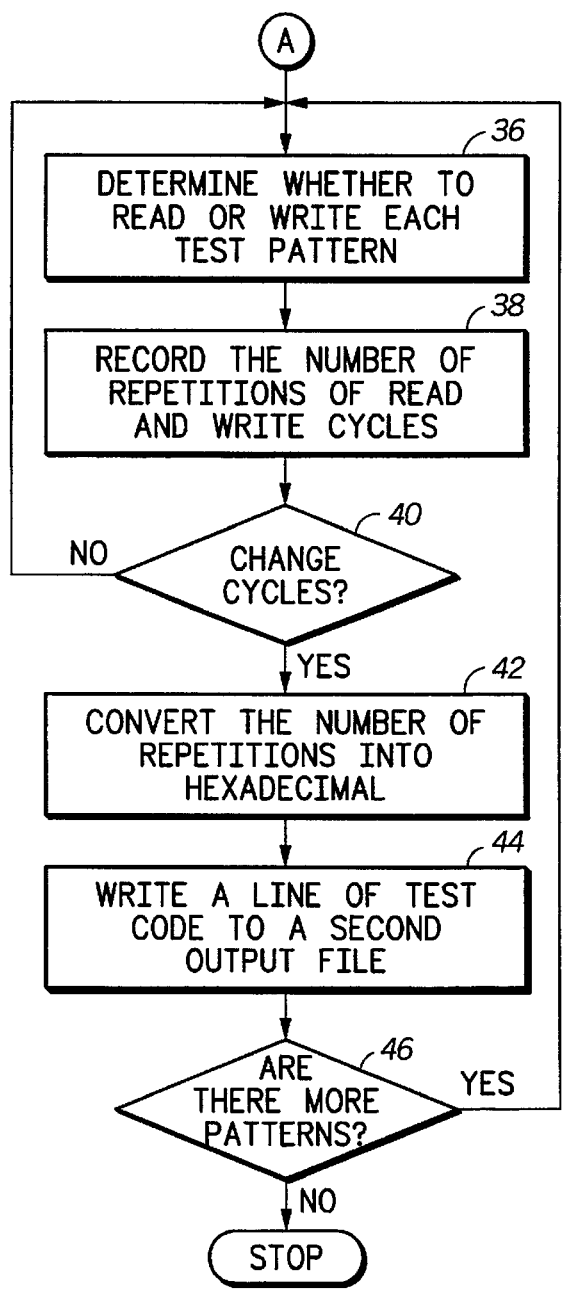

The present invention can be more fully described with reference to FIGS. 1–3. FIGS. 1 and 2 illustrate a flow chart in accordance with an embodiment of the present invention. FIG. 1 illustrates a flow chart of steps to convert logic test vectors to test patterns that are usable by a memory tester. FIG. 2 illustrates a flow chart of steps for generating the memory test code used to apply the test patterns. In FIGS. 1 and 2, diamond-shaped boxes 40 and 46 represent decision steps, and rectangular boxes 20, 22, 24, 26, 27, 28, 30, 32, 36, 38, 42, and 44 represent steps which are performed when converting a logic test vector to a memory test pattern and when generating the corresponding memory test code. A single instruction, or a plurality of instructions may be used to implement each of the illustrated steps.

Figure 3:
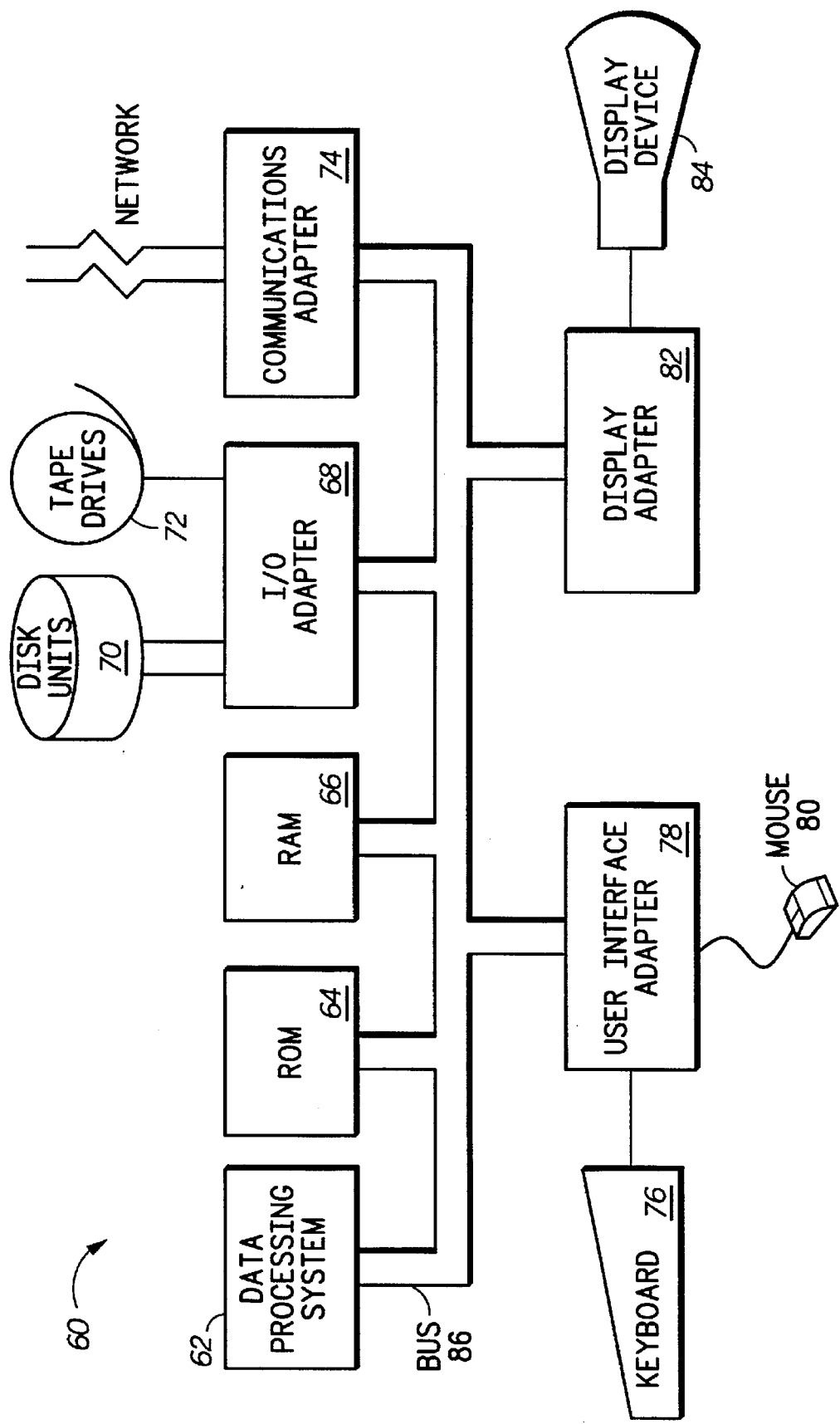
FIG. 3 illustrates a computer system in accordance with the embodiment of FIGS. 1–2.

A plurality of logic test vectors that have been generated for testing the logic circuit on a logic tester are stored into a memory in a computer system that runs Perl, such as computer system 60 illustrated in FIG. 3. A sample set of logic test vectors are illustrated in Table 1 to aid in discussing the program for converting the logic test vectors to memory test patterns in accordance with the present invention. These logic test vectors are for discussion purposes only and are not intended to illustrate a complete set of logic test vectors for testing an actual device.

TABLE 1

| 1 | /T1 ! 1001011LXX L |
| 2 | /T1 ! 1001011XHX X |
| 3 | /T1 ! 1001011XXX X |
| 4 | /T1 ! 1001011XXX X |
| 5 | /T1 ! 1001011XXX X |
| 6 | /T1 ! 1001010XLL X |
| 7 | /T1 ! 1001011XXX X |
| 8 | /T1 ! 1001110HHH X |
| 9 | /T1 ! 1001111HXX X; 200000NS |
| 10 | /T1 ! 1001010LXL X; 20 ;20 |
| 11 | /T1 ! 1001011XXX X |
| 12 | /T1 ! 1001011XXX X |

An actual logic test vector file for testing logic circuitry on a logic tester may include thousands, or even millions of logic test vectors. This program is for converting a large number of logic test vectors to memory test patterns, and generating the memory test code for running the memory test patterns on a memory tester.

Referring to FIG. 1, at step 20, the program first prompts the user to input initial test parameters. The initial test parameters include: (1) entering a name of a file containing the logic test vectors; (2) entering a name for a file for storing the memory test patterns; (3) entering a number of input bits and output bits for the integrated circuit being tested; (4) entering a number that is greater than or equal to the number of input bits and output bits; and (5) entering a name for the memory test code. As an example, if the integrated circuit under test has 11 input/output pins, or terminals, the number of input bits and output bits entered by the user will be "11". However, an ADVANTEST T5363 memory tester can accept either 1, 2, 4, 8, 9, 16, 18, or 36 bit sizes. These bit sizes correspond to the normally used input/output (I/O) widths of an integrated circuit memory. Since the memory tester does not allow 11 bits to be used as a bit size, the next largest number above 11 is 16, which is used for the bit size. To account for the extra unused bits, the program adds 5 trailing zeros to each 11 bit test pattern. The initial test parameters are then stored for use by the program. The program also creates four temporary files that are used to store intermediate results. Note that the numbers 1–12, added at the beginning of each logic test vector in Table 1, are included as an aid to discussion, and may not be present in the actual logic test vector file.

In step 22, unnecessary data is removed from each of the logic test vectors. In the logic test vectors of Table 1, the characters "/T1 !" and the series of characters "; 200000NS" in instruction 9 and the series of characters "; 20; 20" in instruction 10 are removed because they have no meaning for a memory tester. The remaining data of the logic test vectors may include a mix of the characters "1", "0", "H", "L", or "X". The number "1" is used to designate a logic "one", or logic high, and the number "0" is used to designate a logic "zero", or logic low. The letter "H" indicates a logic high state and the letter "L" indicates a logic low state. The letter "X" means "don't care", that is, the logic state of "X" may be either a logic high or a logic low.

At step 24, each "X" in the plurality of logic test vectors is converted to a "0". At step 26, adjacent identical logic test vectors are organized into groups of test vectors and the number of test vectors in each group is recorded. At step 27, the groups of test vectors are saved in a temporary memory file for later use. At step 28, each "H" in the logic test vectors is converted to a "1", and each "L" is converted to a "0". At step 30, the number of test vectors in each group that was compiled in step 26 is converted from a decimal number to a hexadecimal number. Note that the order of the logic test vectors is not changed, only identical test vectors that are adjacent to one another are grouped together. At step 32, the groups of converted, or modified test vectors, or test patterns, are written to a first output file. Steps 22, 24, 26, 28, and 30 are performed to modify the test vectors to test patterns. The test patterns in the first output file will look like the following test patterns in Table 2 after steps 22, 24, 26, 28, and 30 have been performed on the logic test vectors on Table 1.

TABLE 2

| 1 | 1001011000 000000 ! #1 |
| 2 | 1001011010 000000 ! #1 |
| 3 | 1001011000 000000 ! #3 |
| 4 | 1001010000 000000 ! #1 |
| 5 | 1001011000 000000 ! #1 |
| 6 | 1001110111 000000 ! #1 |
| 7 | 1001111100 000000 ! #1 |
| 8 | 1001010000 000000 ! #1 |
| 9 | 1001011000 000000 ! #2 |

In Table 2, the pound symbol (#) is used by the tester to denote a hexadecimal number. Note that the conversion of the letters X, H, and L to corresponding 1's and 0's depends on the type of tester being used. In other embodiments using different testers, a different data conversion may be required, or no data conversion may be necessary. Also, note that 5 trailing zero's have been added by the program to make a bit size of 16, required by the memory tester as discussed above.

The test patterns shown in Table 2 are ready to be loaded and stored into the memory tester's appropriate memory space. The memory test code is then generated by the program. The memory test code is needed for applying the test patterns shown in Table 2 to the logic circuitry of the integrated circuit under test. The appropriate memory space is called a failure analysis memory in the ADVANTEST T5363, and is typically used for testing read only memory (ROM). Because repeated identical test vectors are only listed once followed by the number of repetitions, the actual size of the test pattern file may be smaller than the original logic test pattern file, requiring less memory space than the original logic test vectors. As an example, note that line 3 of Table 2 is generated from lines 3, 4, and 5 of Table 1, and #3 following the 11 bits of data indicates that the line is repeated 3 times when the test patterns are applied to an integrated circuit under test.

The program continues running from step 36 in FIG. 2. FIG. 2 illustrates a flow chart for providing the memory test code for applying the test patterns of Table 2 in accordance with the present invention. At step 36, starting at the top of Table 1, the program determines if each test pattern is to be written to the integrated circuit under test, or if the test pattern is to be read from the integrated circuit under test. To determine whether to write or read each test pattern, the program examines each logic test vector of the groups of test vectors stored in the temporary file created at step 27 for the presence of the letters H and or L. If the logic test vector being examined includes at least one "H" or at least one "L", the corresponding test pattern is to be read from the integrated circuit under test during a read cycle. If the logic test vector does not include an H or an L, the corresponding test pattern is recorded as being provided to the integrated circuit under test during a write cycle.

At step 38, the program records the number of adjacent test patterns that require read cycles, and records the number of adjacent test patterns that require write cycles. At decision step 40, the program determines if the logic test vector just checked at step 38 repeats a read cycle or a write cycle as compared to the previous logic test vector. If the current logic test vector being examined requires a read cycle and the previous logic test vector required a read cycle, then the NO path is taken from step 40 back to step 36 and steps 36, 38, and 40 are repeated for the next logic test vector. Likewise, if the logic test vector currently being examined requires a write cycle and the previous logic test vector required a write cycle, the NO path is taken from step 40 back to step 36 and steps 36, 38, and 40 are repeated for the next logic test vector. However, if the current logic test vector required a read cycle and the previous logic test vector required a write cycle, or vice versa, the YES path is taken from decision step 40 to step 42.

At step 42, the number of repetitions of read cycles and or write cycles is converted to the hexadecimal number system. The number of repetitions of read cycles and the number of repetitions of write cycles is converted to hexadecimal because hexadecimal is the number system required by the memory tester. If the logic test vectors are being converted for use on a different type of tester, the number system may, or may not, need to be converted.

At step 44, a line of memory test code is written to a second output file in a form required by the memory tester. At decision step 46, the program checks for more test patterns. If there are no more test patterns, the NO path is taken and the program is finished. If there are more test patterns, the YES path is taken, and the program returns to step 36, and steps 36, 38, 40, 42, 44, and 46 are repeated.

By way of example, memory test code for the test patterns illustrated in Table 2 is illustrated in Table 3.

TABLE 3

| |
| --- |
| IDXI1 #0 XB<XB+1 YB<YB+1^BX RD |
| IDXI1 #1 XB<XB+1 YB<YB+1^BX |
| NOP XB<XB+1 YB<YB+1^BX RD |
| NOP XB<XB+1 YB<YB+1^BX |
| IDXI1 #1 XB<XB+1 YB<YB+1^BX RD |
| IDXI1 #0 XB<XB+1 YB<YB+1 ^BX |

The first entry of Table 3 illustrates a line of memory test code for applying the first two lines of Table 2. In Table 3, the "IDXI1" is a counter that is incremented for test patterns that are repeated. The hexadecimal number #0 means to repeat the test for next two consecutive lines from Table 2. The hexadecimal #1 means to repeat the test for the next three consecutive lines from Table 2. An "RD" following a line of memory test code means that the test pattern(s) corresponding to that line of code should be read from the integrated circuit under test. The absence of "RD" indicates that the corresponding test pattern should be written to the integrated circuit under test.

During a read cycle of a test pattern marked as requiring a read (indicated by "RD" following the appropriate line of memory test code), the counter is incremented, if necessary, and the first 7 bits are written to the integrated circuit under test. Four bits are read from the integrated circuit under test and compared with the next four bits of the test pattern.

During a write cycle of a test pattern marked as requiring a write (indicated by the absence of "RD" following the appropriate line of memory test code), the counter is incremented, if necessary, and a line of test patterns is simply written to the integrated circuit under test. No read cycle or comparison is done.

A "NOP" proceeding a line of code means to execute the line once, no counter needs to be incremented to record repetitions of that line of memory test code. Addresses are incremented from a base address using the command "XB<XB+1 YB<YB+1^BX", where a "^" represents a carry operation. The "XB" is the X address dimension (row), and the "YB" is the Y address dimension (column).

FIG. 3 illustrates computer system 60 in accordance with the embodiment illustrated in FIGS. 1-2. The computer system shown in FIG. 3 includes data processing system 62, random access memory (RAM) 66, read only memory (ROM) 64, and input output (I/O) adapter 68 for connecting peripheral devices and storage media such as disk units 70 and tape drives 72 to bus 86, user interface adapter 78 for connecting keyboard 76, mouse 80, and/or other user interface devices such as a touch screen device (not shown) to bus 86, communication adapter 74 for connecting the workstation to a data processing network, and display adapter 82 for connecting bus 86 to display device 84.

The program is stored in one of the storage media illustrated in FIG. 3 for being run on computer system 60. Program source code for one embodiment is included herewith as an Appendix. The source code included in the Appendix is written in Perl for use on an HP 720 workstation, manufactured by Hewlett-Packard Company. However, the program can be run on other types of computers that have Perl. As written, the program can convert up to 100 million logic test vectors to test patterns. For any single logic test vector, the program can record up to 65,536 repetitions. Input bits do not have to precede the output bits. If the selected bit size is not equal to the width of the input bits, trailing 0's are added to the test patterns as filler.

In summary, this program functions as a logic test vector converter for converting logic test vectors to memory test patterns. This allows logic circuits to be tested on a memory tester. In addition, the program generates memory test code for applying the test patterns to the logic circuit under test on the memory tester. Therefore, this program allows a logic intensive integrated circuit memory, such as an integrated cache having an onboard cache controller, a data cache, and a cache TAG, to be tested entirely on a memory tester. The program converts a large number of logic test vectors relatively quickly. Testing a logic intensive integrated circuit memory entirely on a memory tester reduces the cost and time associated with testing, as compared to testing the logic circuits of the integrated circuit on a more expensive logic tester, and the memory array on a memory tester.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for testing an integrated circuit including both logic circuitry and a memory array on a memory tester, the method comprising the steps of:

providing logic test vectors for testing the logic circuitry;

determining whether to write or to read the logic test vectors to the integrated circuit being tested using a computer;

modifying the logic test vectors to a form that is readable by the memory tester using the computer;

storing the modified logic test vectors in a computer memory file; and testing the logic circuitry on the memory, tester using the modified logic test vectors.

2. The method of claim 1, further comprising the steps of:

arranging the logic test vectors into groups of identical logic test vectors; and counting how many of the logic test vectors are in each of the groups of identical logic test vectors.

3. The method of claim 2, further comprising a step of identifying and removing unnecessary data from the groups of identical logic test vectors.

4. The method of claim 1, further comprising a step of arranging more than one identical logic test vector into a group of identical logic test vectors.

5. The method of claim 1, further comprising a step of generating test code for a memory tester for inputting the modified logic test vectors to the integrated circuit being tested.

6. The method of claim 1, further comprising the step of storing initial test parameters.

7. The method of claim 1, wherein the step of modifying the logic test vectors to a form that is readable by a memory tester includes a step of converting an "H" in a logic test vector to a "1" and converting an "L" in a logic test vector to a "0".

8. The method of claim 1, wherein the step of determining whether to write or read the logic test vectors to the integrated circuit being tested further comprises counting how many adjacent logic test vectors require write cycles to provide a number of repetitions of write cycles.

9. The method of claim 8, further comprising the step of converting the number of repetitions of write cycles into hexadecimal.

10. A method for testing an integrated circuit having both logic circuits and a memory array, the method comprising the steps of:

providing logic test vectors for testing the logic circuitry;

identifying and removing unnecessary data from the logic test vectors;

arranging the logic test vectors into groups of identical logic test vectors;

counting how many of the logic test vectors are in each of the groups of identical logic test vectors;

determining whether to write or to read each logic test vector to the integrated circuit being tested;

counting adjacent logic test vectors that are to be written and counting adjacent logic test vectors that are to be read to provide a number of repetitions of write cycles and a number of repetitions of read cycles;

modifying the logic test vectors to a form that is readable by a memory tester using the computer; and testing the logic circuitry on the memory tester using the modified logic test vectors.

11. The method of claim 10, further comprising a step of generating test code for a memory tester for inputting the modified logic test vectors to the integrated circuit being tested.

12. The method of claim 11, further comprising the step of storing initial test parameters, the initial test parameters comprising:

entering a name of a file containing the logic test vectors;

entering a name for a file to contain the memory test patterns;

entering a number of input bits and output bits for the integrated circuit being tested;

entering a number that is greater than or equal to the number of input bits and output bits; and entering a name for the test code.

13. The method of claim 10, wherein the step of modifying the logic test vectors to a form that is readable by a memory tester includes a step of converting an "H" in a logic test vector to a "1" and converting an "L" in a logic test vector to a "0".

14. The method of claim 10, further comprising the step of converting the number of repetitions of write cycles and the number of repetitions of read cycles into hexadecimal.

15. A storage media for storing a logic test vector converter, the logic test vector converter for converting a plurality of logic test vectors to a plurality of memory test patterns, the storage media comprising:

a plurality of instructions for arranging the plurality of logic test vectors into groups of identical logic test vectors, the plurality of logic test vectors for testing an integrated circuit having logic circuits on a logic tester;

a plurality of instructions for counting how many logic test vectors are in the groups of identical logic test vectors;

a plurality of instructions for determining whether to write or to read the groups of identical logic test vectors to the integrated circuit;

a plurality of instructions for modifying the plurality of logic test vectors to a form that is readable by a memory tester; and a plurality of instructions for storing the modified plurality of logic test vectors in a memory test pattern file, the modified plurality of logic test vectors for testing the integrated circuit having logic circuits on a memory tester.

16. The storage media of claim 15, further comprising an instruction for identifying and removing unnecessary data from the groups of identical logic test vectors.

17. The storage media of claim 15, further comprising a plurality of instructions for generating test code for a memory tester for inputting the modified logic test vectors to the integrated circuit being tested.

18. The storage media of claim 15, further comprising an instruction for storing initial test parameters.

19. The storage media of claim 15, wherein the plurality of instructions for modifying the plurality of logic test vectors to a form that is readable by a memory tester includes an instruction for converting an "H" in a logic test vector to a "1" and converting an "L" in a logic test vector to a "0".

20. The storage media of claim 15, wherein the plurality of instructions for determining whether to write or read the groups of logic test vectors to the integrated circuit being tested further comprises an instruction for counting repetitions of adjacent write cycles and adjacent read cycles to provide a number of repetitions of the write cycles and read cycles.

21. The storage media of claim 20, further comprising an instruction for converting the number of repetitions of adjacent write cycles and the number of adjacent read cycles into hexadecimal.

* * * * *